US012665384B2

(12) United States Patent
Wu et al.

(10) Patent No.: US 12,665,384 B2
(45) Date of Patent: Jun. 23, 2026

(54) LASER CHIPS ATTACHED TO A PHOTONICS CHIP BY MULTIPLE ADHESIVES

(71) Applicant: GlobalFoundries U.S. Inc., Malta, NY (US)

(72) Inventors: Zhuojie Wu, Port Chester, NY (US); Yusheng Bian, Ballston Lake, NY (US); Koushik Ramachandran, Wappingers Falls, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 622 days.

(21) Appl. No.: 18/134,068

(22) Filed: Apr. 13, 2023

(65) Prior Publication Data

US 2024/0348005 A1     Oct. 17, 2024

(51) Int. Cl.
| | |
|---|---|
| *H01S 5/024* | (2006.01) |
| *G02B 6/42* | (2006.01) |
| *H01S 5/0233* | (2021.01) |
| *H01S 5/02345* | (2021.01) |
| *H01S 5/0236* | (2021.01) |

(Continued)

(52) U.S. Cl.
CPC ........ *H01S 5/02469* (2013.01); *G02B 6/4215* (2013.01); *G02B 6/4239* (2013.01); *H01S 5/0233* (2021.01); *H01S 5/02345* (2021.01); *H01S 5/0236* (2021.01); *H01S 5/0237* (2021.01); *H01S 5/18305* (2013.01)

(58) Field of Classification Search
CPC ... G02B 6/4215; G02B 6/4239; H01S 5/0233; H01S 5/02345; H01S 5/0236; H01S 5/0237; H01S 5/02469
See application file for complete search history.

(56) References Cited

U.S. PATENT DOCUMENTS

| | | | |
|---|---|---|---|
| 9,606,308 B2 | 3/2017 | Barwicz et al. | |
| 9,698,072 B2 | 7/2017 | Brofman et al. | |

(Continued)

OTHER PUBLICATIONS

P.-C. Pan et al., "Effect of Thermal Management on the Performance of VCSELs," in IEEE Transactions on Electron Devices, vol. 67, No. 9, pp. 3736-3739, Sep. 2020, doi: 10.1109/TED.2020.3007724.

(Continued)

*Primary Examiner* — Daniel Petkovsek
(74) *Attorney, Agent, or Firm* — Thompson Hine LLP; Anthony Canale

(57)                ABSTRACT
Structures including a photonics chip and a surface-mounted laser chip, and methods of forming same. The structure comprises a photonics chip including a surface, a laser chip including a light output and a body that are spaced from the surface of the photonics chip, a first adhesive between the body of the laser chip and the surface of the photonics chip, and a second adhesive between the body of the laser chip and the surface of the photonics chip. The light output is oriented toward the surface of the photonics chip, the first adhesive has a first thermal conductivity, the second adhesive has a second thermal conductivity that is less than the first thermal conductivity of the first adhesive, and the second adhesive is disposed in a light path between the light output of the laser chip and the surface of the photonics chip.

19 Claims, 7 Drawing Sheets

(51) Int. Cl.
    *H01S 5/0237*     (2021.01)
    *H01S 5/183*     (2006.01)

(56)                References Cited

U.S. PATENT DOCUMENTS

| | | |
|---|---|---|
| 11,075,122 B2 | 7/2021 | Shioda et al. |
| 11,217,460 B2 | 1/2022 | Kulkarni et al. |
| 2018/0156972 A1* | 6/2018 | Kainuma ............... H05K 1/183 |
| 2021/0173145 A1* | 6/2021 | Fasano ................ G02B 6/1225 |
| 2022/0075112 A1* | 3/2022 | Cardile .................... G02B 6/42 |
| 2024/0154384 A1* | 5/2024 | Wu ..................... H01S 5/02375 |

OTHER PUBLICATIONS

Y. Bian et al., "3D Integrated Laser Attach Technology on 300-mm Monolithic Silicon Photonics Platform," 2020 IEEE Photonics Conference (IPC), Vancouver, BC, Canada, 2020, pp. 1-2, doi: 10.1109/IPC47351.2020.9252280.
Huihui Lu, Jun Su Lee, Yan Zhao, Carmelo Scarcella, Paolo Cardile, Aidan Daly, Markus Ortsiefer, Lee Carroll, and Peter O'Brien, "Flip-chip integration of tilted VCSELs onto a silicon photonic integrated circuit," Optics Express 24, 16258-16266 (2016).
Y. Bian et al., "Hybrid III-V laser integration on a monolithic silicon photonic platform," 2021 Optical Fiber Communications Conference and Exhibition (OFC), San Francisco, CA, USA, 2021, pp. 1-3.

\* cited by examiner

LASER CHIPS ATTACHED TO A PHOTONICS CHIP BY MULTIPLE ADHESIVES

BACKGROUND

This disclosure relates to photonics chips and, more specifically, to structures including a photonics chip and a surface-mounted laser chip, and methods of forming same.

Photonics chips are used in many applications and systems including, but not limited to, data communication systems and data computation systems. A photonics chip includes a photonic integrated circuit comprised of optical components, such as modulators, polarizers, and optical couplers, that are used to manipulate light received by an edge coupler from a light source, such as a laser or an optical fiber.

A laser source may be integrated with the photonics integrated circuit as an independent chip that is attached to the photonics chip and disposed adjacent to the edge coupler. A laser source generates a significant amount of heat during operation. The performance and reliability life of the laser source is tied to effective thermal management. In conventional photonics chips, laser-generated heat is primarily dissipated to the photonics chip through solder joints at the attachment locations and an optical coupling adhesive between the laser source and the edge coupler.

Improved structures including a photonics chip and a surface-mounted laser chip, and methods of forming same, are needed.

SUMMARY

In an embodiment of the invention, a structure comprises a photonics chip including a surface, a laser chip including a light output and a body that are spaced from the surface of the photonics chip, a first adhesive between the body of the laser chip and the surface of the photonics chip, and a second adhesive between the body of the laser chip and the surface of the photonics chip. The light output is oriented toward the surface of the photonics chip, the first adhesive has a first thermal conductivity, the second adhesive has a second thermal conductivity that is less than the first thermal conductivity of the first adhesive, and the second adhesive is disposed in a light path between the light output of the laser chip and the surface of the photonics chip.

In an embodiment of the invention, a method comprises forming a first adhesive on a surface of a photonics chip, placing a laser chip including a light output and a body that are spaced from the surface of the photonics chip, and forming a second adhesive between the body of the laser chip and the surface of the photonics chip. The first adhesive is disposed between the body of the laser chip and the photonics chip, the light output is oriented toward the surface of the photonics chip, the first adhesive has a first thermal conductivity, the second adhesive has a second thermal conductivity that is less than the first thermal conductivity of the first adhesive, and the second adhesive is disposed in a light path between the light output of the laser chip and the surface of the photonics chip.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
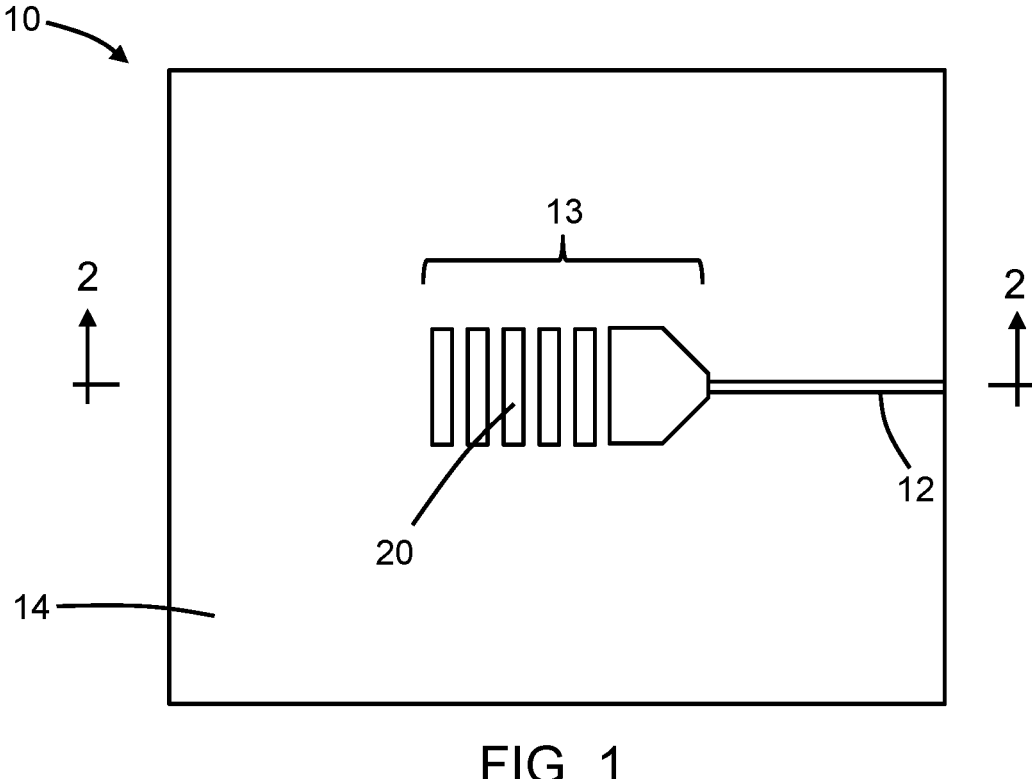
FIG. 1 is a top view of a structure at an initial fabrication stage of a processing method in accordance with embodiments of the invention.
Figure 2:
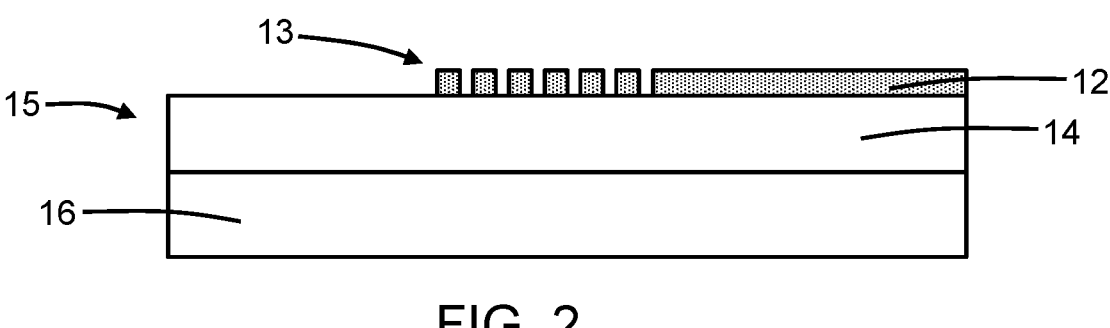
FIG. 2 is a cross-sectional view taken generally along line 2-2 in FIG. 1.

With reference to FIGS. 1, 2 and in accordance with embodiments of the invention, a structure 10 includes a waveguide core 12 and a grating coupler 13 that are positioned on, and over, a dielectric layer 14 and a substrate 16 of a photonics chip 15. In an embodiment, the dielectric layer 14 may be comprised of a dielectric material, such as silicon dioxide, and the substrate 16 may be comprised of a semiconductor material, such as single-crystal silicon. In an embodiment, the dielectric layer 14 may be a buried oxide layer of a silicon-on-insulator substrate, and the dielectric layer 14 may separate the waveguide core 12 and grating coupler 13 from the substrate 16. In an alternative embodiment, the waveguide core 12 and grating coupler 13 may be separated from the dielectric layer 14 by one or more additional dielectric layers comprised of, for example, silicon dioxide.

In an embodiment, the waveguide core 12 and grating coupler 13 may be comprised of a material having a refractive index that is greater than the refractive index of silicon dioxide. In an embodiment, the waveguide core 12 and grating coupler 13 may be comprised of a semiconductor material, such as single-crystal silicon or polysilicon. In an alternative embodiment, the waveguide core 12 and grating coupler 13 may be comprised of a dielectric material, such as silicon nitride, silicon oxynitride, or aluminum nitride. In alternative embodiments, other materials, such as a III-V compound semiconductor, may be used to form the waveguide core 12 and grating coupler 13.

In an embodiment, the waveguide core 12 and grating coupler 13 may be formed by patterning a layer of their constituent material with lithography and etching processes.

In an embodiment, an etch mask may be formed by a lithography process over the layer, and unmasked sections of the layer may be etched and removed by an etching process. The shape of the etch mask may determine the patterned shape of the waveguide core 12 and grating coupler 13. In an embodiment, the waveguide core 12 and grating coupler 13 may be formed by patterning the semiconductor material (e.g., single-crystal silicon) of a device layer of a silicon-on-insulator substrate.

The waveguide core 12 and the grating coupler 13 are optical components of a photonic integrated circuit of the photonics chip 15. The grating coupler 13 may include segments 20 that are separated by gaps and a tapered transition from the segments 20 to the waveguide core 12. In an alternative embodiment, a longitudinally-extending rib, which may be tapered, may be overlaid on some or all of the segments 20 and bridge the corresponding gaps. In an embodiment, the pitch and duty cycle of the segments 20 may be uniform to define a periodic arrangement. In alternative embodiments, the pitch and/or the duty cycle of the segments 20 may be apodized (i.e., non-uniform) to define an aperiodic arrangement. The segments 20 may be dimensioned and positioned at small enough pitch so as to define a sub-wavelength grating that does not radiate or reflect light at a wavelength of operation.

Figures 3, 4:
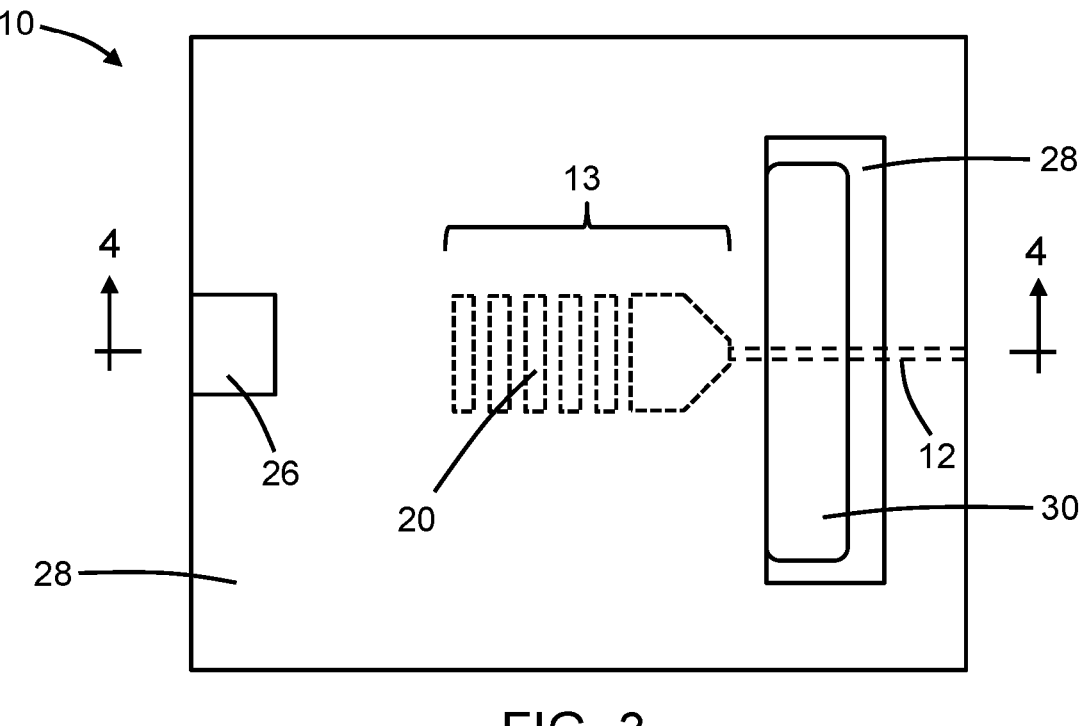
FIG. 3 is a top view of the structure at a fabrication stage subsequent to FIG. 1.
FIG. 4 is a cross-sectional view taken generally along line 4-4 in FIG. 3.

With reference to FIGS. 3, 4 in which like reference numerals refer to like features in FIGS. 1, 2 and at a subsequent fabrication stage, a dielectric layer 22 may be formed on, and over, the waveguide core 12 and the grating coupler 13. The dielectric layer 22 may be comprised of a dielectric material, such as silicon dioxide, having a refractive index that is less than the refractive index of the material constituting the waveguide core 12 and grating coupler 13. The waveguide core 12 and grating coupler 13 may be embedded in the dielectric layer 22, and the dielectric layer 22 may have a thickness greater than a height of the waveguide core 12 and grating coupler 13.

The dielectric layer 22 may be disposed in the gaps between adjacent pairs of the segments 20. The segments 20 and the dielectric material of the dielectric layer 22 in the gaps between adjacent pairs of the segments 20 may define a metamaterial structure in which the material constituting the segments 20 has a higher refractive index than the dielectric material of the dielectric layer 22. The metamaterial structure can be treated as a homogeneous material having an effective refractive index that is intermediate between the refractive index of the material constituting the segments 20 and the refractive index of the dielectric material constituting the dielectric layer 22.

A back-end-of-line stack 24 may be formed on, and over, the dielectric layer 22 to complete the photonics chip 15. The back-end-of-line stack 24 may include interlayer dielectric layers that are comprised of a dielectric material, such as silicon dioxide, silicon nitride, tetraethylorthosilicate silicon dioxide, or fluorinated-tetraethylorthosilicate silicon dioxide. Bond pads 26, 28, which may be comprised of copper and other metals, may be formed in a topmost interconnect level and exposed at a top surface 25 of the photonics chip 15 represented by the uppermost interlayer dielectric layer of the back-end-of-line stack 24. A solder bump 30, which may be comprised of tin and other metals, may be disposed on the bond pad 28. In an embodiment, the bond pad 26 may lack solder. The bond pads 26, 28 may facilitate an electrical interconnection to a discrete electronic device, such as a subsequently-added laser chip.

Figure 5:
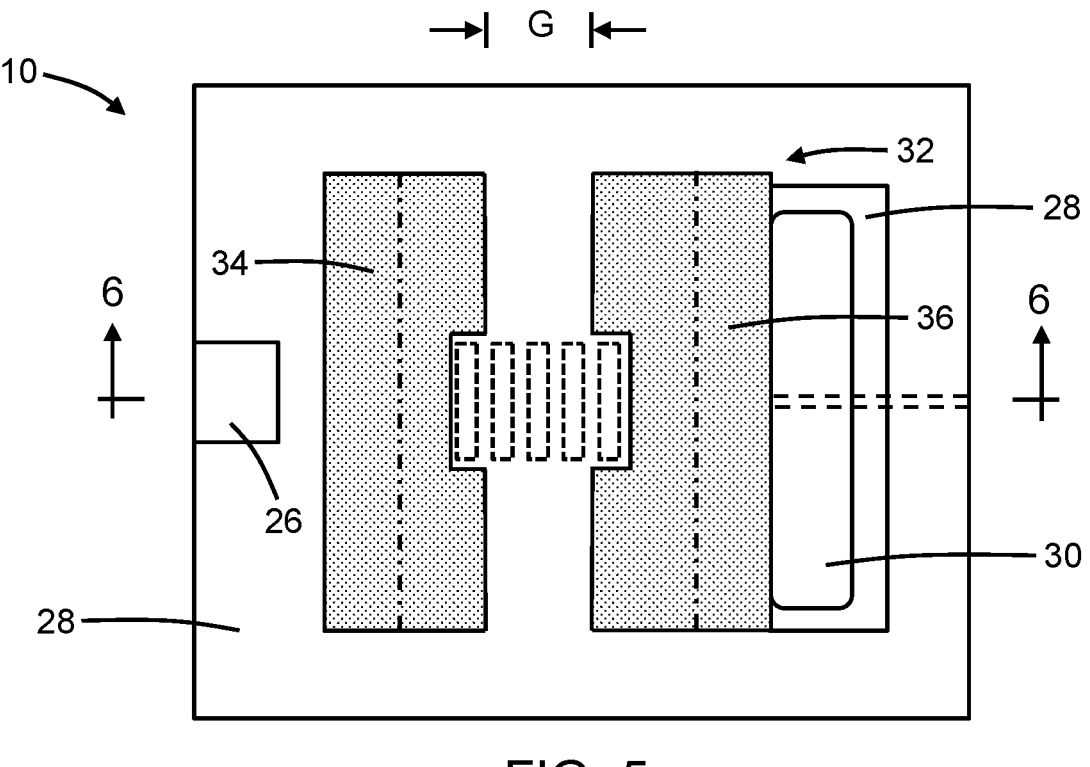
FIG. 5 is a top view of the structure at a fabrication stage subsequent to FIG. 3.
Figure 6:
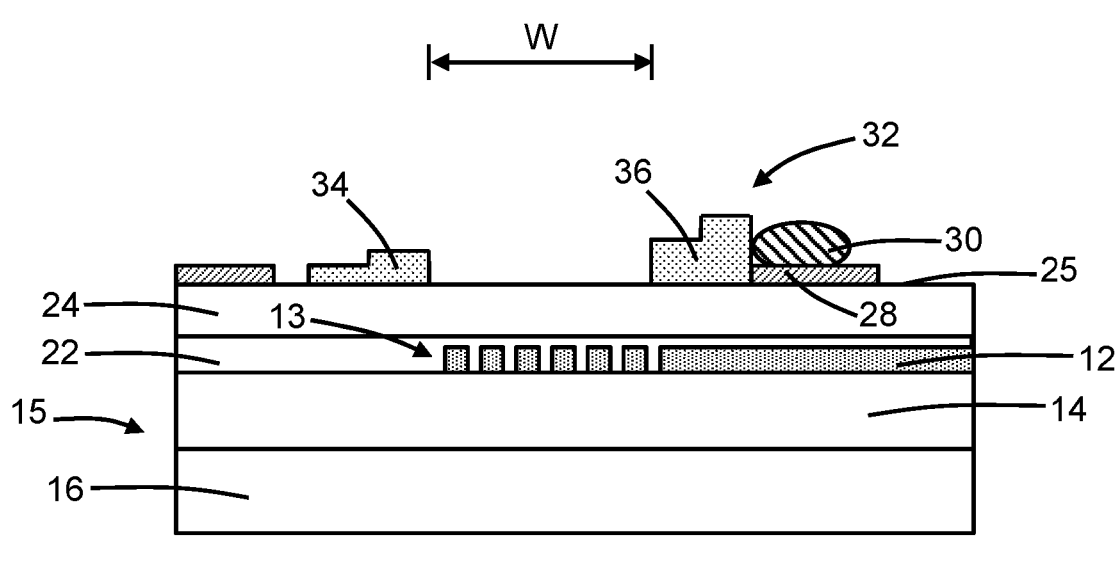
FIG. 6 is a cross-sectional view taken generally along line 6-6 in FIG. 5.

With reference to FIGS. 5, 6 in which like reference numerals refer to like features in FIGS. 3, 4 and at a subsequent fabrication stage, an adhesive 32 is formed on the top surface 25 of the photonics chip 15 and, more specifically, on the back-end-of-line stack 24 in the space between the bond pad 26 and the bond pad 28. The adhesive 32 may include a section 34 and a section 36 that are disconnected and that are separated in a lateral direction by a gap G. The central region of the gap G that is directly over the grating coupler 13 may have a larger width dimension W than the peripheral portions of the gap G that are not directly over the grating coupler 13. The section 34 of the adhesive 32 may be disposed adjacent to the bond pad 26, and the section 36 of the adhesive 32 may be disposed adjacent to the bond pad 28. The sections 34, 36 of the adhesive 32 may overlap with different portions of the grating coupler 13.

In an embodiment, the adhesive 32 may include an organic binder and a particle filler distributed in the organic binder. In an embodiment, the adhesive 32 may be a composite including an organic binder and particles of an inorganic particle filler dispersed in the organic binder. The organic binder may be comprised of a polymer, an epoxy, or a resin. The particle filler in the adhesive 32 may include particles that are comprised of a non-metal material, such as silicon dioxide, boron oxide, calcium oxide, carbon, aluminum nitride, or boron nitride. In an alternative embodiment, the adhesive 32 may be a die attach material including particles that are comprised of a metal, which may further improve the thermal conductivity of the adhesive 32. The thermal conductivity of the adhesive 32 may be tailored through properties such as the particle size and the filler content of the particles (i.e., particle concentration in weight percent) in the binder. In an embodiment, the particle filler in the adhesive 32 may have a mean particle size of about one micron. In an embodiment, the adhesive 32 may be characterized by a thermal conductivity that is greater than or equal to 0.2 W/m-K.

The section 34 of the adhesive 32 adjacent to the bond pad 26 may have portions of multiple thicknesses with the thinner portion adjacent to the bond pad 26 and the thicker portion adjacent to the gap G. The section 36 of the adhesive 32 adjacent to the bond pad 28 may have portions of multiple thicknesses with the thinner portion adjacent to the bond pad 28 and the thicker portion adjacent to the gap G. In an embodiment, the thickness of one or both of the portions of the section 36 may be greater than the thickness of either portion of the section 34. In an embodiment, the adhesive 32 may be dispensed as a fluid and cured to form the sections 34, 36. In an embodiment, the adhesive 32 may be applied as respective solid sheets and optionally cured to form the sections 34, 36.

Figure 7:
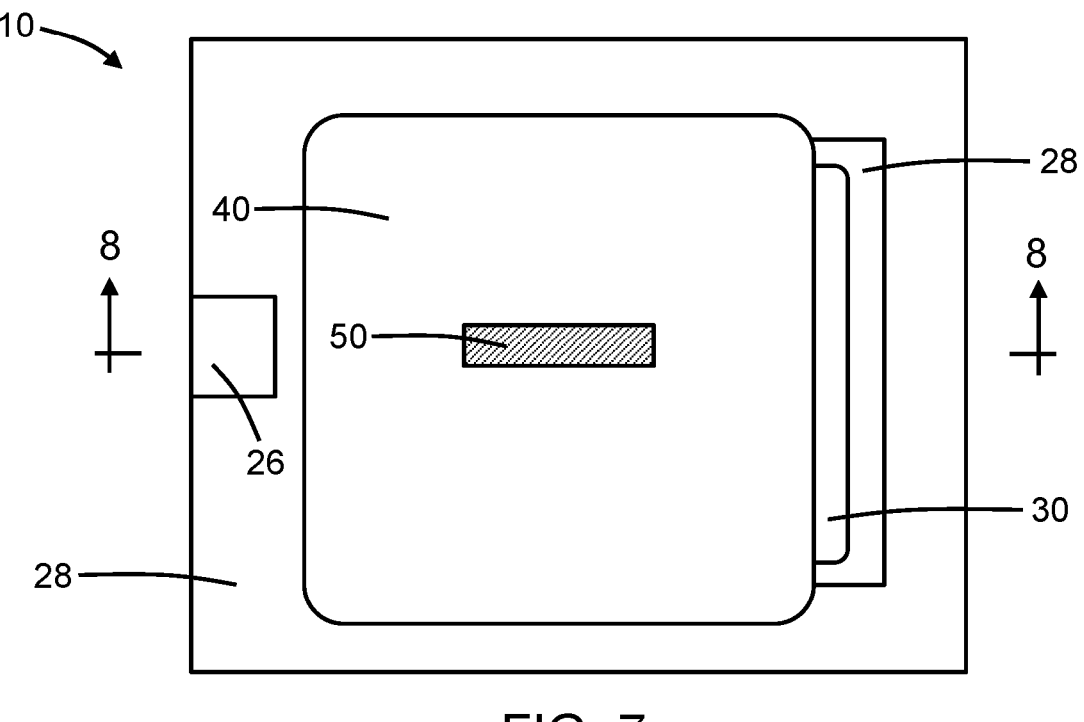
FIG. 7 is a top view of the structure at a fabrication stage subsequent to FIG. 5.
Figure 8:
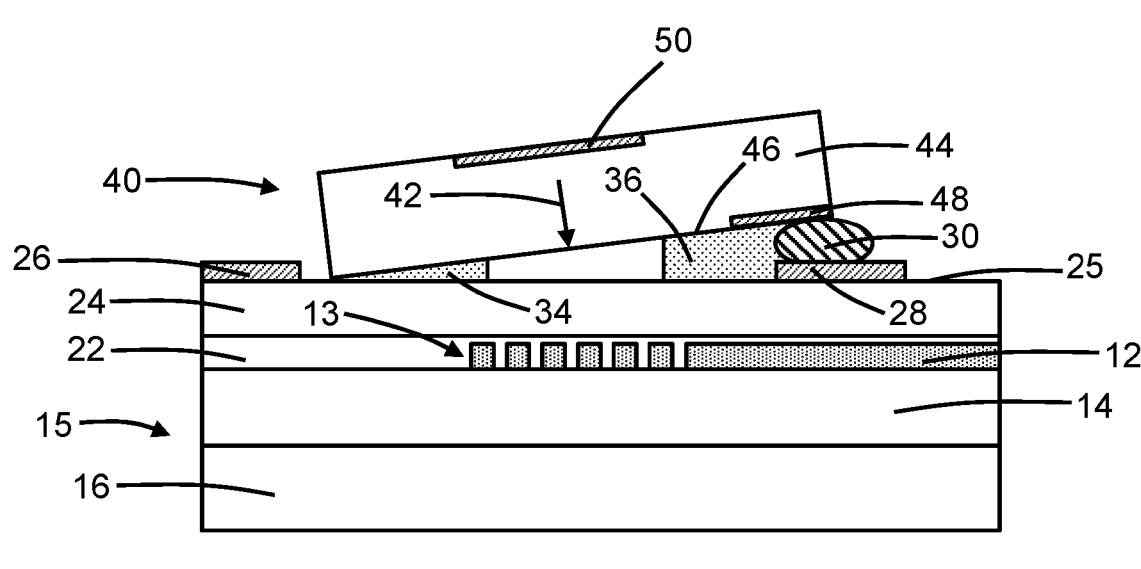
FIG. 8 is a cross-sectional view taken generally along line 8-8 in FIG. 7.

With reference to FIGS. 7, 8 in which like reference numerals refer to like features in FIGS. 5, 6 and at a subsequent fabrication stage, a laser chip 40 is placed adjacent to the top surface 25 of the photonics chip 15. The laser chip 40 may contact the sections 34, 36 of the adhesive 32 and the solder bump 30 on the bond pad 28. The laser chip 40 includes a light output, diagrammatically shown by the single-headed arrow 42, that is oriented toward the top surface 25 of the photonics chip 15. In an embodiment, the light output 42 of the laser chip 40 may be oriented toward the grating coupler 13 and the central portion of the gap G between the sections 34, 36 of the adhesive 32. Inlets to the gap G remain at locations adjacent to the edges of the laser chip 40 after the laser chip 40 is contacted with the solder bump 30 and adhesive 32. The placement of the laser chip 40 may modify the respective shapes of the sections 34, 36 of the adhesive 32. The solder bump 30 may also collapse under reflow to further modify the shapes of the sections 34, 36 of the adhesive 32. In an embodiment, the contacted sections 34, 36 of the adhesive 32 may have wedge shapes that are arranged on opposite sides of the gap G with the section 36 having an average thickness and a minimum thickness that are greater than the average thickness and minimum thickness of the section 34. In an embodiment, the thickness of the adhesive 32 may increase in a direction from the bond pad 26 toward the bond pad 28. In an embodiment, the thicknesses of the adhesive 32 may monotonically increase in a direction from the bond pad 26 to the bond pad 28. The width dimension of the gap G may be slightly reduced by the modified shape of the sections 34, 36. The height of the gap G may be similarly non-uniform (e.g., wedge-shaped) due to the non-uniform thickness of the adhesive 32 and may increase in a direction from the section 34 toward the section 36. The laser chip 40 is tilted relative to the top surface 25 due to the non-uniform adhesive thickness such that the light output 42 of the laser chip 40 is angled relative to the grating coupler 13. For example, the light output 42 of the laser chip 40 may be tilted at an angle of 10° relative to the top surface 25 and the grating coupler 13 due to the non-uniform thickness of the adhesive 32.

The laser chip 40 has a body 44 with a bottom surface 46 that is spaced from the top surface 25 of the photonics chip 15 by the adhesive 32. In an embodiment, the adhesive 32 may extend fully from the top surface 25 to the bottom surface 46 of the body 44 of the laser chip 40. In an embodiment, the adhesive 32 may contact the top surface 25 of the photonics chip 15 and the bottom surface 46 of the body 44 of the laser chip 40. In an embodiment, the adhesive 32 may directly contact the top surface 25 of the photonics chip 15 and the bottom surface 46 of the body 44 of the laser chip 40. In an embodiment, the bottom surface 46 may be inclined at the same tilt angle as the light output 42.

In an embodiment, the laser chip 40 may be a laser diode configured to emit laser light of a given wavelength, intensity, mode shape, and mode size from the light output 42. In an embodiment, the laser chip 40 may be a vertical-cavity surface-emitting laser (VCSEL) that is a type of semiconductor laser diode with laser beam emission perpendicular from the bottom surface 46, which differs from edge-emitting semiconductor lasers (e.g., in-plane lasers). In an embodiment, the laser chip 40 may include a laser comprised of III-V compound semiconductor materials. In an embodiment, the laser chip 40 may include an indium phosphide/indium-gallium-arsenic phosphide laser that is configured to generate continuous laser light in an infrared wavelength range for emission from the light output 42. In an alternative embodiment, the laser chip 40 may be replaced by an optical fiber.

The laser chip 40 may include a contact 48 that is exposed at the bottom surface 46 and that may be attached to bond pad 28 by reflowing the solder bump 30 such that the contact 48 of the laser chip 40 is mechanically and electrically connected to the bond pad 28. The laser chip 40 may further include a contact 50 that is disposed on an upper surface of the body 44 opposite from the bottom surface 46. The absence of a solder bump on the bond pad 26 may contribute to the inclination of the laser chip 40 and the tilting of the light output 42 along with a contribution from the non-uniform adhesive thickness.

Figure 9:
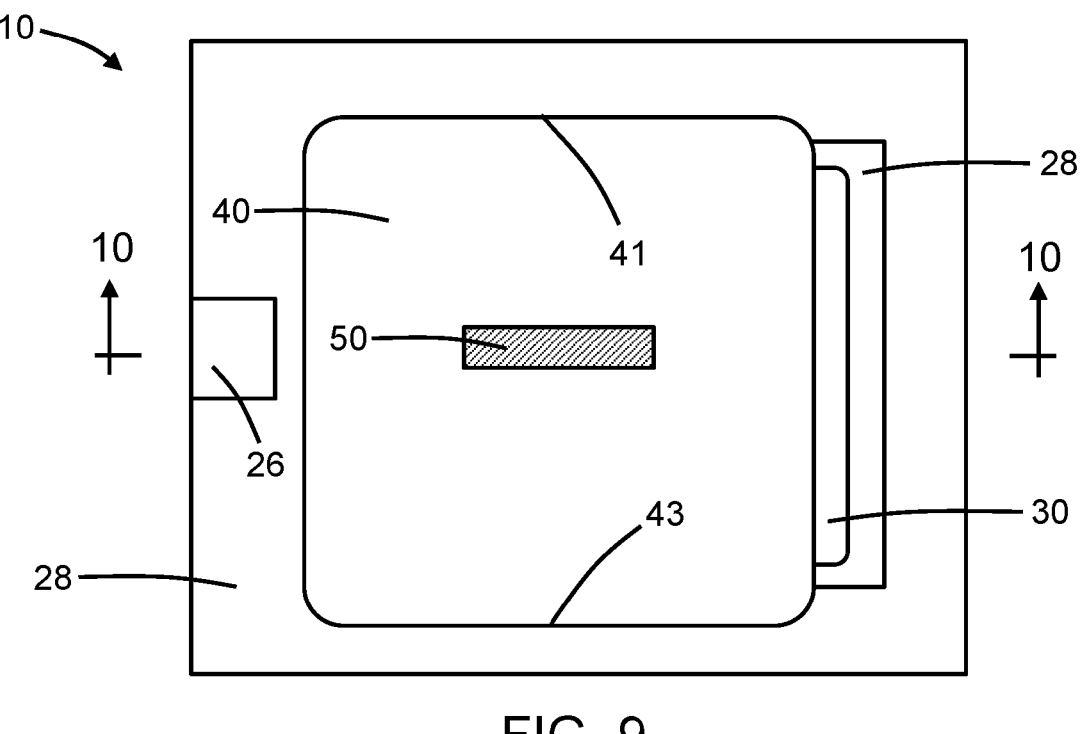
FIG. 9 is a top view of the structure at a fabrication stage subsequent to FIG. 7.
Figure 10:
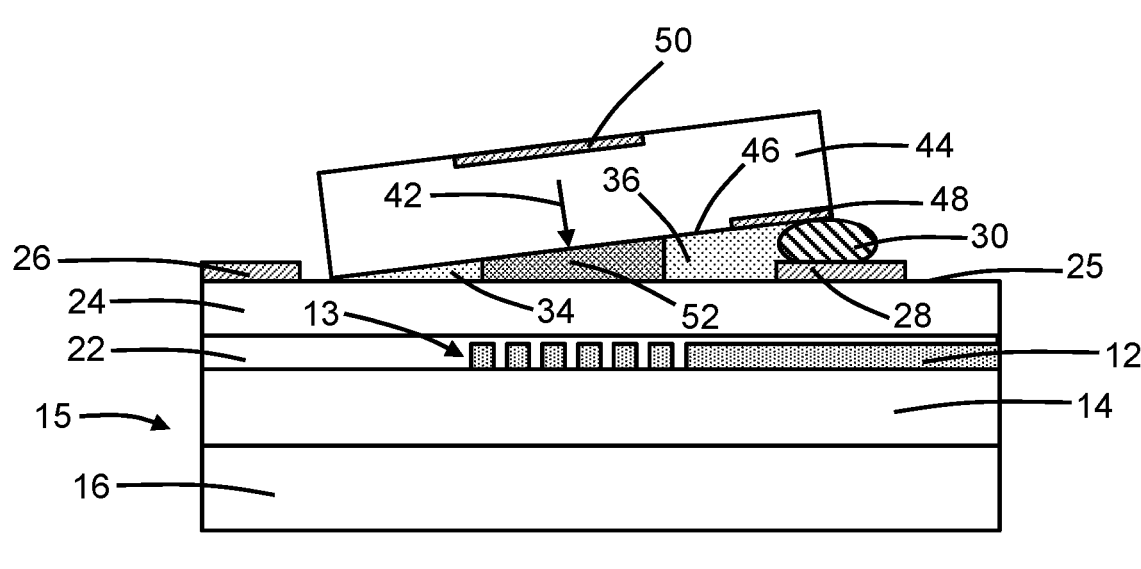
FIG. 10 is a cross-sectional view taken generally along line 10-10 in FIG. 9.

With reference to FIGS. 9, 10 in which like reference numerals refer to like features in FIGS. 7, 8 and at a subsequent fabrication stage, an adhesive 52 is formed beneath the laser chip 40 and, more specifically, in the gap G between the laser chip 40 and the photonics chip 15. In an embodiment, the adhesive 52, which may be highly flowable before curing, may be dispensed adjacent to opposite sidewalls 41, 43 of the laser chip 40 and allowed to wick, via capillary action, into the gap G between the laser chip 40 and the top surface 25 of the photonics chip 15, which may be followed by a thermal cure of both adhesives 32, 52. The sections 34, 36 of the adhesive 32 may effectively function as dams that guide the flow of the adhesive 52 across the gap G. The adhesive 52 is disposed in a vertical direction between the light output 42 from the laser chip 40 and the grating coupler 13. An adhesive fillet (not shown) may be formed about the sidewalls, including the sidewalls 41, 43, of the laser chip 40.

The adhesive 52 is disposed in the gap G on the top surface 25 of the photonics chip 15. In an embodiment, the adhesive 52 may extend in a vertical direction from the top surface 25 to the bottom surface 46 of the body 44 of the laser chip 40 and in a lateral direction from the section 34 of the adhesive 32 to the section 36 of the adhesive 32 such that the gap G is filled. In an embodiment, the adhesive 52 may contact the bottom surface 46 of the body 44 of the laser chip 40, as well as the top surface 25. In an embodiment, the adhesive 52 may directly contact the bottom surface 46 of the body 44 of the laser chip 40, as well as the top surface 25. In an embodiment, the adhesive 52 inside the gap G may contact both sections 34, 36 of the adhesive 32. In an embodiment, the adhesive 52 inside the gap G may directly contact both sections 34, 36 of the adhesive 32.

The adhesive 52 has a different composition than the adhesive 32 and different properties than the adhesive 32. In an embodiment, the adhesive 52 may be characterized as an optical adhesive that improves optical coupling in comparison with air. In an embodiment, the adhesive 52 may have a thermal conductivity that is less than thermal conductivity of the adhesive 32. The higher thermal conductivity of the adhesive 32 may reduce the thermal impedance during operation of the laser chip 40. The adhesive 32 may be chosen to have a coefficient of thermal expansion and modulus that is independent of the coefficient of thermal expansion and modulus of the adhesive 52, which may permit an improvement in the mechanical properties for chip attachment in comparison with a complete fill by only an adhesive that is comparable to the adhesive 32.

Figure 11:
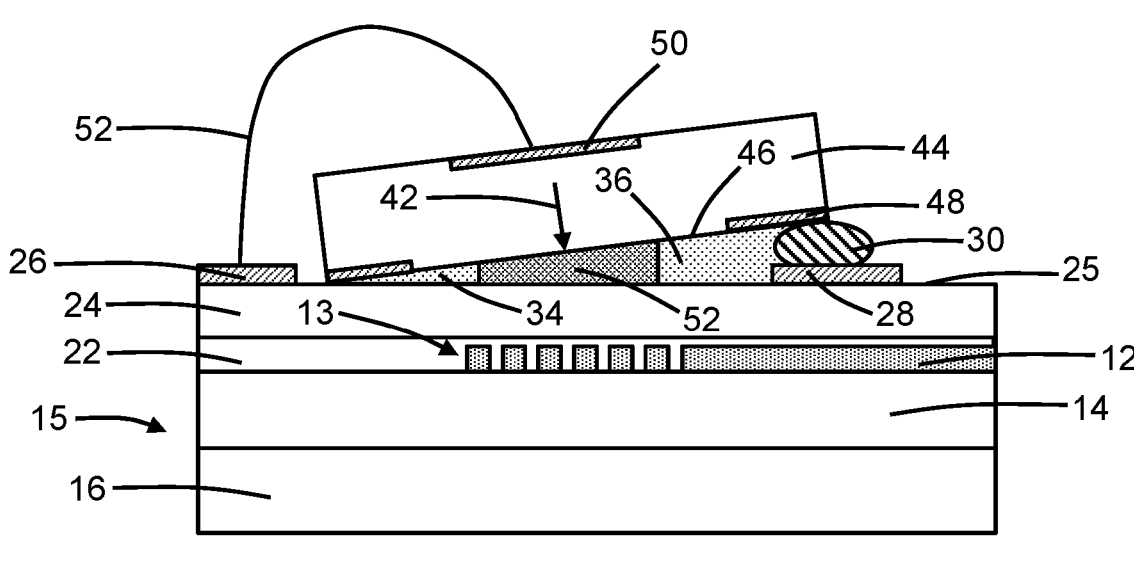
FIG. 11 is a cross-sectional view of the structure at a fabrication stage subsequent to FIGS. 9, 10.

With reference to FIG. 11 in which like reference numerals refer to like features in FIGS. 9, 10 and at a subsequent fabrication stage, a wire bond 54 may be formed that connects the bond pad 26 to the contact 50 of the laser chip 40. In an alternative embodiment, the laser chip 40 may include another contact on the top surface of the body 44 that replaces the contact 48 and that is attached by a wire bond to the bond pad 28. In an alternative embodiment, the laser chip 40 may include another contact on the bottom surface 46 that replaces the contact 50 and is bonded to the bond pad 26 by reflowed solder.

In use, light (e.g., laser light) may be emitted in a downward direction from the light output 42 of the laser chip 40 at a tilt angle toward the grating coupler 13. The light propagates through the adhesive 52 in the portion of the light path between the laser chip 40 and the photonics chip 15. The light then propagates in another portion of the light path through the back-end-of-line stack 24 to the grating coupler 13, which captures the light and directs the captured light to the waveguide core 12. The light propagates in the waveguide core 12 to the photonics integrated circuit on the photonics chip 15. Heat generated by the laser chip 40 may be dissipated to the photonics chip 15 by, at least in part, the adhesive 32, which improves the efficiency of heat transfer due to the thermal conductivity that is greater than the thermal conductivity of the adhesive 52.

The combination of adhesive 32 and adhesive 52 may permit both optical requirements and thermal requirements to be satisfied for a given application. The adhesive 52 may be characterized by optical properties that are optimized to promote light coupling between the light output 42 of the laser chip 40 and the grating coupler 13 and to improve the refractive index match between the laser chip 40 and the back-end-of-line stack 24. The optical properties of the adhesive 52 may also be optimized to reduce back reflection to the light output 42 of the laser chip 40. The adhesive 32 improves the ability to conduct heat generated by the laser chip 40 away from the laser chip 40 to the photonics chip 15, which lowers the operating temperature of the laser chip 40 and/or enables a higher light output power. The particle concentration in the adhesive 32 may also improve the thermo-mechanical reliability of the structure 10.

Figure 12:
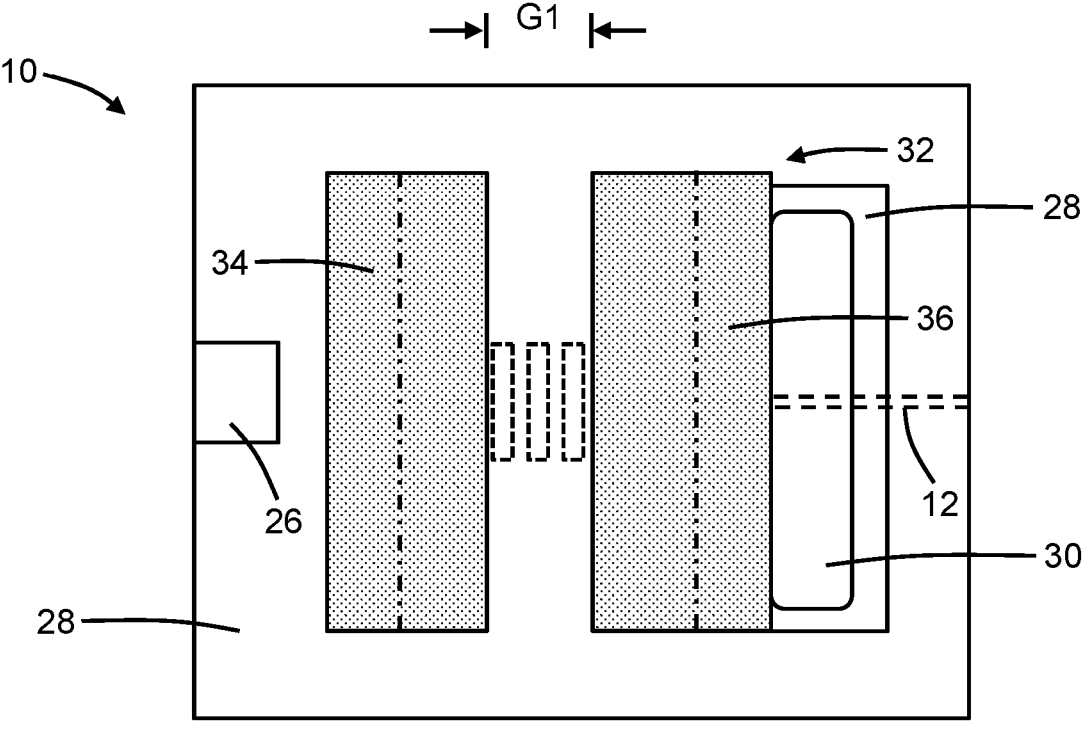
FIG. 12 is a top view of a structure in accordance with alternative embodiments of the invention.

With reference to FIG. 12 and in accordance with alternative embodiments, the sections 34, 36 of the adhesive 32 may be modified to be strips for which the gap G has a uniform width. The gap G lacks the widened portion over the grating coupler 13. The adhesive 52, which is subsequently formed beneath the laser chip 40 inside the gap G, will likewise have a uniform width between the sections 34, 36 of the adhesive 32 that control the flow of the dispensed adhesive 52 into the gap G.

Figure 13:
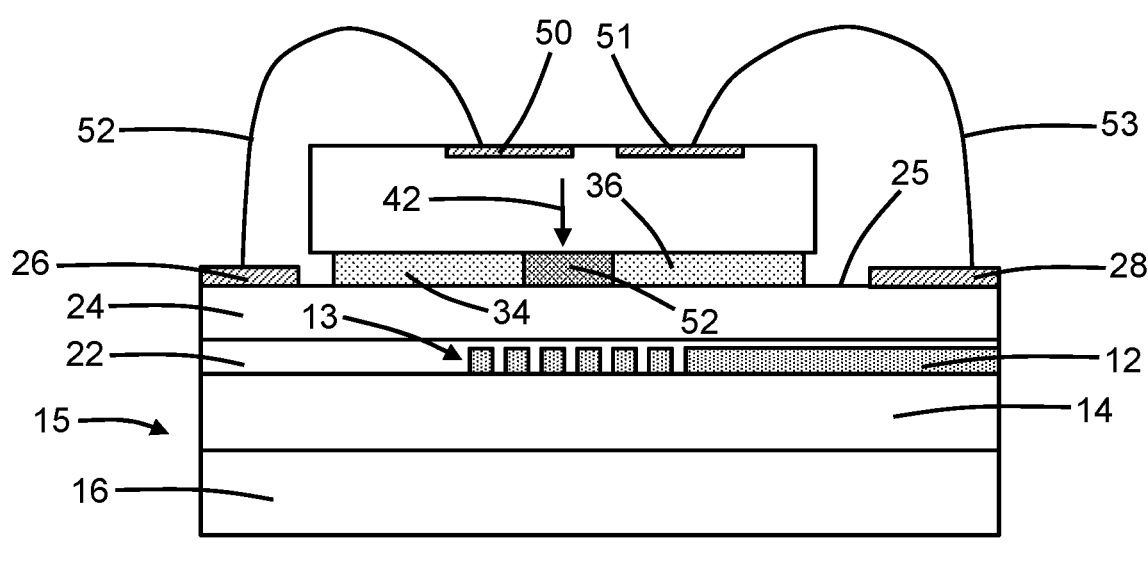
FIG. 13 is a cross-sectional view of a structure in accordance with alternative embodiments of the invention.

With reference to FIG. 13 and in accordance with alternative embodiments, the laser chip 40 may include an additional contact 51 on its upper surface, and the contact 51 may be coupled to the bond pad 28 by a wire bond 53. Because of the manner in which the electrical connections are made, the light output 42 of the laser chip 40 may be aligned perpendicular to the top surface 25 of the photonics chip 15. In an embodiment, the sections 34, 36 of the adhesive 32 may have a uniform thickness or a substantially uniform thickness, both when applied to the top surface 25 and after the laser chip 40 is attached.

Figure 14:
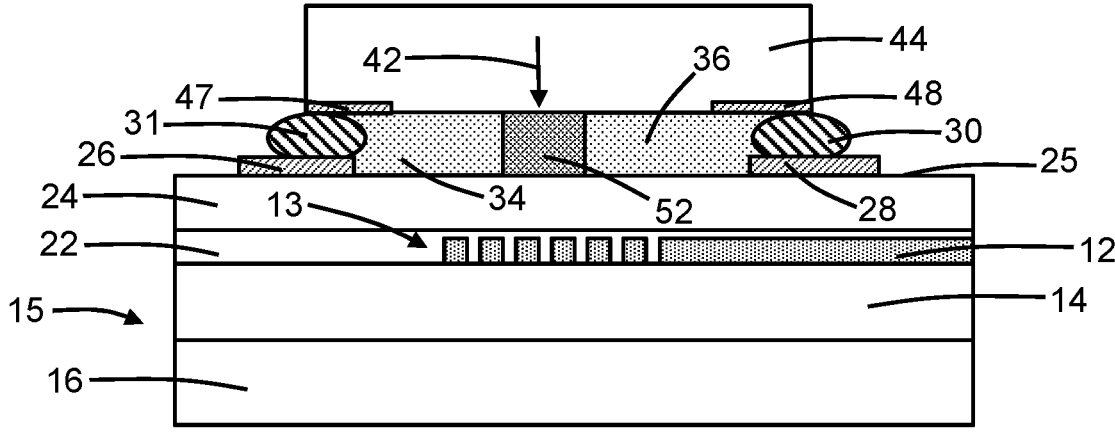
FIG. 14 is a cross-sectional view of a structure in accordance with alternative embodiments of the invention.

With reference to FIG. 14 and in accordance with alternative embodiments, the laser chip 40 may include an additional contact 47 on its bottom surface 46 and the contact 47 may be coupled to the bond pad 26 by a reflowed solder bump 31. Because of the manner in which the electrical connections are made, the light output 42 of the laser chip 40 may be aligned perpendicular to the top surface 25 of the photonics chip 15. In an embodiment, the sections 34, 36 of the adhesive 32 may have a uniform thickness or a substantially uniform thickness, both when applied to the top surface 25 and after the laser chip 40 is attached.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a photonics chip including a surface and a grating coupler;
   a laser chip including a light output and a body that are spaced from the surface of the photonics chip, the body of the laser chip including a surface;
   a first adhesive between the surface of the body of the laser chip and the surface of the photonics chip, the first adhesive having a first thermal conductivity, and the first adhesive including a first section and a second section; and
   a second adhesive between the surface of the body of the laser chip and the surface of the photonics chip, the second adhesive having a second thermal conductivity that is less than the first thermal conductivity of the first adhesive, the second adhesive positioned in a lateral direction between the first section and the second section of the first adhesive, and the second adhesive disposed in a light path between the light output of the laser chip and the surface of the photonics chip,
   wherein the laser chip is configured to emit light from the light output that propagates in the light path through the second adhesive toward the grating coupler.

2. The structure of claim 1 wherein the first adhesive and the second adhesive each extend fully from the surface of the photonics chip to the surface of the body of the laser chip.

3. The structure of claim 1 wherein the first adhesive and the second adhesive each contact the surface of the photonics chip, and the first adhesive and the second adhesive each contact the surface of the body of the laser chip.

4. The structure of claim 1 wherein the second thermal conductivity is greater than or equal to 0.2 W/m-K.

5. The structure of claim 1 wherein the second adhesive comprises an organic binder and a plurality of particles in the organic binder.

6. The structure of claim 5 wherein the plurality of particles comprise a metal.

7. The structure of claim 1 wherein the laser chip is a vertical-cavity surface-emitting laser.

8. The structure of claim 1 wherein the first section of the first adhesive contacts the second adhesive, and the second section of the first adhesive contacts the second adhesive.

9. The structure of claim 1 wherein the first section of the first adhesive has a first thickness, and the second section of the first adhesive has a second thickness that is greater than the first thickness.

10. The structure of claim 9 wherein the photonics chip includes a back-end-of-line stack having a first bond pad and a second bond pad that are disposed at the surface of the photonics chip, the first adhesive and the second adhesive are arranged between the first bond pad and the second bond pad, the first section of the first adhesive is adjacent to the first bond pad, and the second section of the first adhesive is adjacent to the second bond pad.

11. The structure of claim 10 wherein the laser chip includes a first contact and a second contact, and further comprising:

a wire bond that couples the first contact to the first bond pad; and a solder bump that couples the second contact to the second bond pad.

12. The structure of claim 1 wherein the first section of the first adhesive has a first thickness, and the second section of the first adhesive has a second thickness that is equal to the first thickness.

13. The structure of claim 12 wherein the photonics chip includes a back-end-of-line stack having a first bond pad and a second bond pad that are disposed at the surface of the photonics chip, the first adhesive and the second adhesive are arranged between the first bond pad and the second bond pad, the first section of the first adhesive is adjacent to the first bond pad, and the second section of the first adhesive is adjacent to the second bond pad.

14. The structure of claim 13 wherein the laser chip includes a first contact and a second contact, and further comprising:

a first wire bond that couples the first contact to the first bond pad; and a second wire bond that couples the second contact to the second bond pad.

15. The structure of claim 13 wherein the laser chip includes a first contact and a second contact, and further comprising:

a first solder bump that couples the first contact to the first bond pad; and a second solder bump that couples the second contact to the second bond pad.

16. The structure of claim 1 wherein the surface is inclined at an angle relative to the surface of the photonics chip.

17. The structure of claim 16 wherein the angle is 10°.

18. The structure of claim 1 wherein the first section of the first adhesive is wedge-shaped, and the second section of the first adhesive is wedge-shaped.

19. A method comprising:

forming a first adhesive on a surface of a photonics chip, wherein the first adhesive has a first thermal conductivity, and the first adhesive includes a first section and a second section;

placing a laser chip including a light output and a body that are spaced from the surface of the photonics chip, wherein the body of the laser chip includes a surface, and the first adhesive is disposed between the surface of the body of the laser chip and the surface of the photonics chip; and forming a second adhesive between the surface of the body of the laser chip and the surface of the photonics chip, wherein the second adhesive has a second thermal conductivity that is less than the first thermal conductivity of the first adhesive, the second adhesive is positioned in a lateral direction between the first section and the second section of the first adhesive, and the second adhesive is disposed in a light path between the light output of the laser chip and the surface of the photonics chip, wherein the photonics chip includes a grating coupler, and the laser chip is configured to emit light from the light output that propagates in the light path through the second adhesive toward the grating coupler.

* * * * *